United States Patent [19]
Harward et al.

[11] Patent Number: 5,485,105
[45] Date of Patent: Jan. 16, 1996

[54] APPARATUS AND METHOD FOR PROGRAMMING FIELD PROGRAMMABLE ARRAYS

[75] Inventors: Mark G. Harward, Dallas; David D. Wilmoth, Allen, both of Tex.

[73] Assignee: Texas Instruments Inc., Dallas, Tex.

[21] Appl. No.: 283,469

[22] Filed: Aug. 1, 1994

[51] Int. Cl.$^6$ .................... H03K 19/173; H01H 37/76
[52] U.S. Cl. .................. 326/38; 326/39; 327/525; 437/172
[58] Field of Search .................... 327/525; 326/38, 326/39, 41, 47, 9; 365/96, 225.7; 437/170, 172, 922

[56] References Cited

U.S. PATENT DOCUMENTS

| | | | |
|---|---|---|---|
| 5,008,855 | 4/1991 | Eltouhky et al. | 365/225.7 |
| 5,130,777 | 7/1992 | Galbraith et al. | 365/225.7 |
| 5,194,759 | 3/1993 | El-Ayat et al. | 327/525 |
| 5,371,414 | 12/1994 | Galbraith | 326/38 |

OTHER PUBLICATIONS

Texas Instruments FPGA Data Manual, "Action Logic System Overview," pp. 3–4, 3–5, 3–9, 3–10, 3–23, 4–3 through 4–36, and 5–4, 1993.

Primary Examiner—Edward P. Westin
Assistant Examiner—Jon Santamauro
Attorney, Agent, or Firm—William B. Kempler; Douglas A. Sorensen; Richard L. Donaldson

[57] ABSTRACT

The described embodiments of the present invention provide an apparatus and method for rapidly programming field programmable devices. A dummy antifuse is provided on the field programmable device for testing prior to actual programming. The current drawn by the device is measured by the programming apparatus until an adequate soaking current is measured while programming the test antifuse. The programming apparatus then records the time required this current level and selects that time as the programming period $T_p$. This programming time $T_p$ is then used to program the entire device. $T_p$ is now the minimum time required given the process variations of this particular device to adequately program the antifuses which must be blown.

21 Claims, 3 Drawing Sheets

APPARATUS AND METHOD FOR PROGRAMMING FIELD PROGRAMMABLE ARRAYS

FIELD OF THE INVENTION

The present invention is related to the field of field programmable arrays. More specifically, the present invention relates to a method and apparatus for programming field programmable arrays using antifuses.

BACKGROUND OF THE INVENTION

Recently, a class of devices in integrated circuits called field programmable devices have been developed. With these devices, the customer is able to receive raw unprogrammed devices and can program these devices to behave according to the characteristics necessary for their application in the field. A common way of implementing field programmable devices is the use of an antifuse. An antifuse derives its name from its characteristics, i.e., when a programming voltage is applied to the antifuse it changes from an open circuit to a short circuit. This is opposite the traditional fuse which is changed from a short circuit to an open circuit by the passage of sufficient current through the fuse. Antifuses have gained popularity due to their compact size and relatively easy fabrication.

In order to program or "blow" an antifuse, a programming voltage $V_{pp}$ is placed across the dielectric of the antifuse. Two references describing examples of antifuses are shown in Hamdy, et al., U.S. Pat. No. 4,899,205, issued Feb. 6, 1990 and Mohsen et al., European Patent Application No. 0 250 078 A3. An example of programming in a simple orthagonal array is described with regard to FIG. 1. The desired device to be programmed is antifuse 10-2-2 while the other antifuses 10-1-1, 10-2-1, 10-3-1, 10-1-2, 10-3-2, 10-1-3, 10-2-3, and 10-3-3 are to remain "unblown". To accomplish this, a reference voltage of zero volts is applied to bitline B-2 and one half of the programming voltage $V_{pp}/2$ is applied to bitlines B-1 and B-3. Also, the programming voltage $V_{pp}$ is applied to wordline W-2 and one half of the programming voltage $V_{pp}/2$ is applied to wordlines W-1 and W-3. In this arrangement, only antifuse 10-2-2 has the full $V_{pp}$ voltage applied across it. All of the other antifuses have either a zero voltage drop across their dielectric or $V_{pp}/2$.

In order to insure proper programming, a sufficient current must pass through the antifuse 10-2-2 after the rupture of the dielectric in the antifuse. This is called soaking current. The soaking current insures that metal bridges through the hole or holes punctured in the dielectric by the application of the programming voltage are formed to provide a reliable low resistance antifuse connection. These bridges are formed by localized melting of the antifuse plates. The soaking current provides the thermal energy to cause this melting.

To insure that adequate soaking current is applied, prior art programming techniques apply the programming voltage from time $t_0$ to $t_1$ as shown in FIG. 2. This programming time $t_p$ is selected to insure that adequate soaking current occurs for all of the process possible variations in the fabrication of the device. However, during programming, the voltage $V_{pp}/2$ is applied to unprogrammed devices during programming. While not programming these antifuses, the application of this voltage stresses the dielectric of the unprogrammed antifuses which weakens or ages the dielectric. Over the lifetime of the field programmable device, sufficient stress will occur to cause shorts on unprogrammed antifuses if excessively aged during programming. This will destroy the usefulness of the device and it must be replaced. The stress applied during programming accelerates the process that causes these failures. Therefore, it is desirable to minimize the stress applied to unprogrammed devices during the programming of the device. Also, the use of a programming time $t_p$, which must be longer than that required for all reasonable process variations, maximizes the programming time required. In a device having up to 4 million antifuses (under present technology) and beyond (in the future) the additional time required to program each device can became significant. Excessive programming times limit the throughput of the customer's operation for programming of field programmable devices. Therefore, it is desirable to reduce the programming time.

SUMMARY OF THE INVENTION

The described embodiments of the present invention provide an apparatus and method for rapidly programming field programmable devices. A dummy antifuse is provided on the field programmable device for testing prior to actual programming. The current drawn by the device is measured by the programming apparatus until an adequate soaking current is measured while programming the test antifuse. The programming apparatus then records the time required to reach this current level and selects that time as the programming period $t_p$. This programming time $t_p$ is then used to program the entire device. The determined $t_p$ is the minimum time required for this particular device to adequately program the antifuses. Thus programming time is minimized as well as programming stress on unprogrammed devices.

In an alternative embodiment, a separate antifuse structure is connected to separate ground pad and a test programming pad. Dummy transistors are formed in the path between the programming pads and the dummy antifuse to simulate the transistors in the programming path of the array. This antifuse is then blown while the current drawn is measured. At a specific adequate soaking current, the time required is recorded. This time is then used as the programming time for the subsequent blowing of other programmed antifuses.

DETAILED DESCRIPTION OF THE INVENTION

Figure 1:
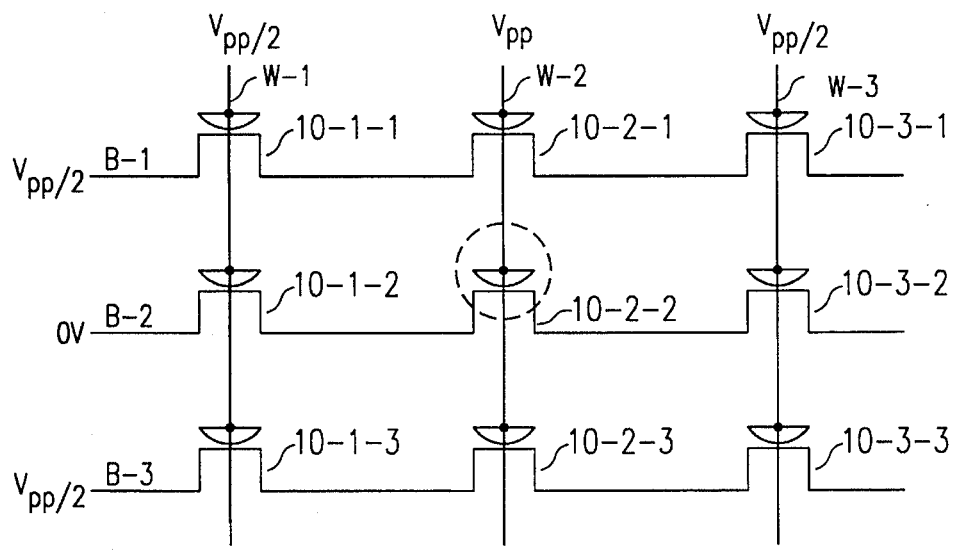
FIG. 1 is a schematic diagram showing a prior art array of antifuses.
Figure 2:
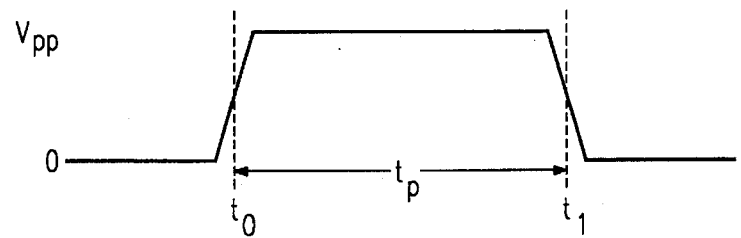
FIG. 2 is a time line diagram showing the programming voltage applied as in the prior art.
Figure 3:
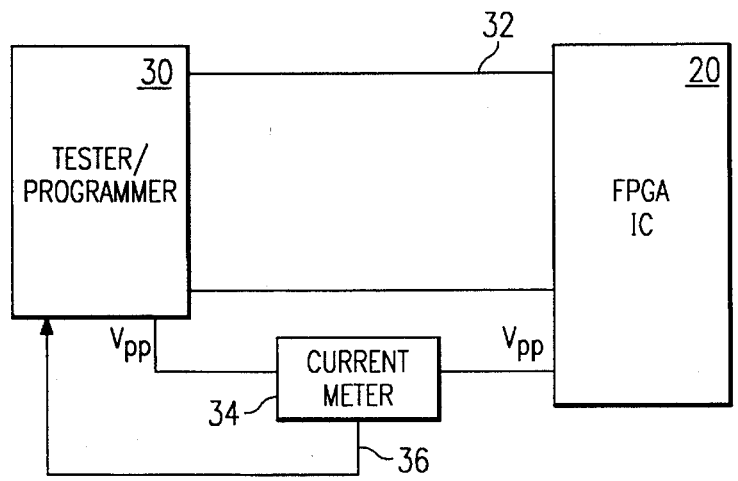
FIG. 3 is a block diagram of an embodiment of the present invention.

FIG. 3 is a block diagram of an embodiment of the present invention. Field programmable array 20 is connected to tester/programmer 30. Bus 32 provides connection of signals between field programmable array 20 and tester/programmer 30. This bus is usually in the form of a socket with a bus of wires connected to the programming socket for the integrated circuit 20. The programming voltage $V_{pp}$ is provided by tester/programmer 30 through current meter 34. Current meter 34 is designed to provide a signal on line 36 to tester/programmer 30 indicating when a selected current is reached. This current is selected based on testing of the devices during the development phase of the field programmable array of when adequate soaking has occurred.

Figure 4:
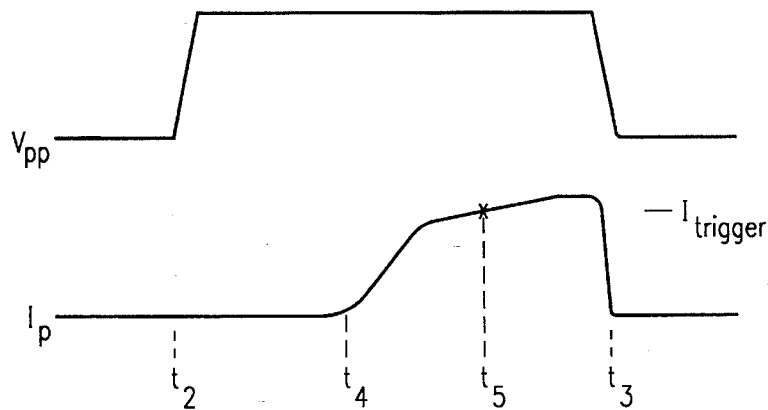
FIG. 4 is a time line diagram showing the programming voltage and programming current according to the methods of the present invention.

FIG. 4 is a time line diagram showing the voltage $V_{pp}$ applied to a test fuse in integrated circuit 20. Time $t_2$ through $t_3$ is selected to be an interval much longer than necessary for programming the test antifuse on array 20. The curve shown for $I_p$ is the programming curve under an example of programming the test antifuse on array 20. The current provided will be relatively low until approximately time $t_4$ when the dielectric will begin breaking down and significant current flows through the test antifuse. At a certain time $t_5$, selected soaking current has been reached. Current meter 34 then provides a signal to tester/programmer 30 and the interval from time $t_2$ to $t_5$ is recorded in tester/programmer 30 (FIG. 3) for further use. During actual programming of the antifuses on integrated circuit 20, this period from $t_2$ to $t_5$ will be used, thus providing the minimum time necessary to insure adequate programming of the fuses. This minimizes the stress applied to unprogrammed fuses and minimizes the time necessary for programming.

Figure 5:
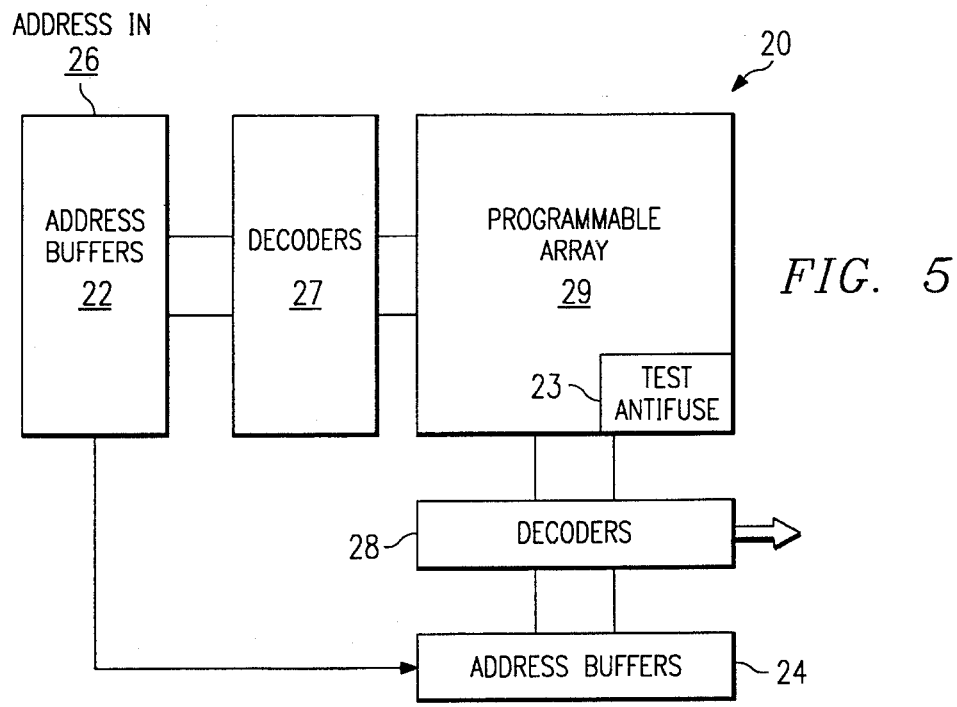
FIG. 5 is a block diagram showing an array including a test antifuse according to an embodiment of the present invention.

FIG. 5 is a block diagram of programmable array 20 of FIG. 3. Addresses are clocked-in to address buffers 22 and 24 by address input 26. These addresses are then decoded by decoders 27 and 28 and applied to array 29. In array 20, certain addresses are reserved for signature addresses (for information such as the lot from which the array was fabricated for reliability analysis work). Also, at least one reserved address is allowed for test antifuse 23. During the determination of the period $t_2$ to $t_5$, as described with above with regard to FIG. 4, the address of antifuse 23 is loaded into address buffers 22 and 24 and thus the current path of the applied $V_{pp}$ is applied to antifuse 23.

Figure 6:
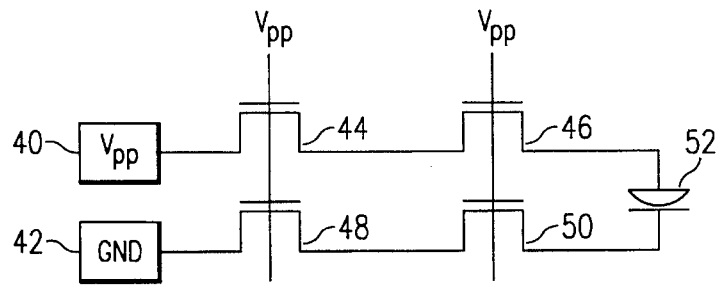
FIG. 6 is a schematic diagram showing another embodiment of the present invention.

An alternative embodiment is shown in FIG. 6. In FIG. 6, rather than using the addressing system for the regular array, additional pins on field programmable array 20 are provided for the application of $V_{pp}$ to pin 40 and ground to pin 42. Transistors 44, 46, 48 and 50 are placed in the path between paths 40 and 42 and antifuse 52. The voltage $V_{pp}$ is also applied to the gates of transistors 44, 46, 48, and 50. In another alternative embodiment, a higher voltage may be applied to the gates of transistors 44, 46, 48, and 50 to insure that the full $V_{pp}$ is applied to antifuse 52. This higher voltage may be generated on chip or may be provided off of the chip. The transistors interposed between paths 40 and 42 and antifuse 52 simulate the intervening circuitry in the actual array between the pins and antifuses of the array. In a normal array many more than the four transistors shown will be required to adequately simulate the current path to antifuse 52. Any number of transistors may be placed in the path to provide adequate simulation of this path.

Figure 7:
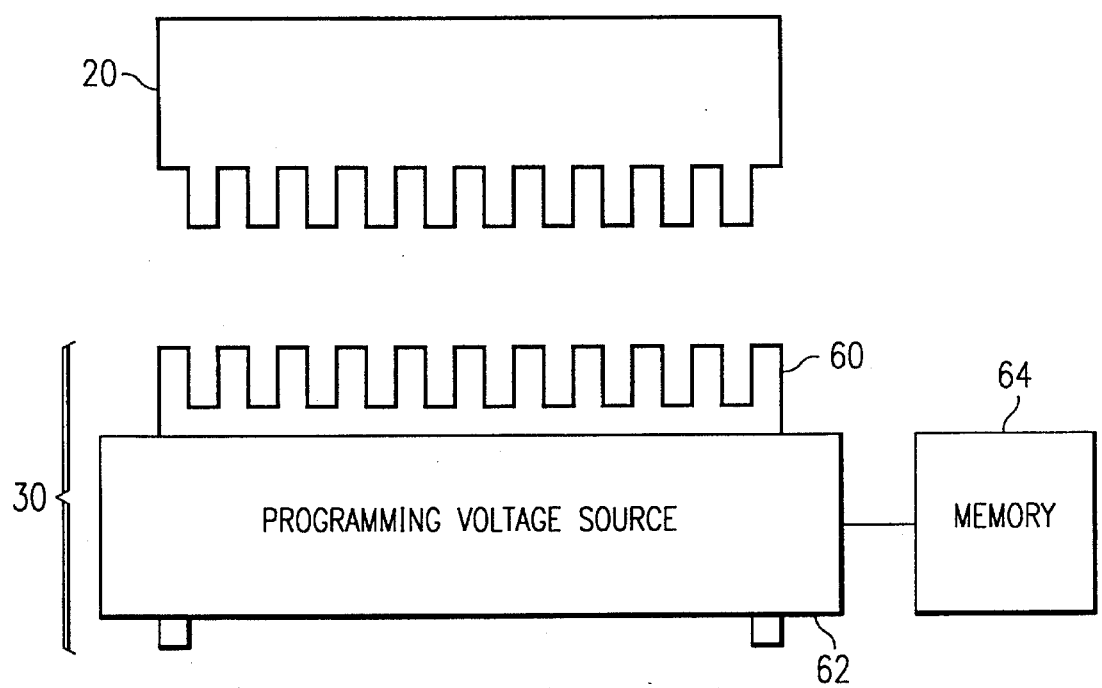
FIG. 7 is a frontview of a tester/programmer showing the programming voltage source, the receptacle, a field programmable array and a memory, in accordance with the invention.

FIG. 7 shows a tester/programmer 30 having a programming voltage source 62 coupled to a receptacle 60 for receiving a field programmable array 20. The field programmable array 20 has a plurality of pins which are received in the receptacle and may have a body which is encapsulated in plastic, for example. A memory 64 is coupled to the programming voltage source for recording the time of application of the programming voltage until the threshold is reached and for providing the time to control the programming of the antifuses in the field programmable device. The memory could be incorporated in to the tester/programmer 30, if desired.

Although specific embodiments of the present invention are described herein, there are not to be construed as limiting the scope of the invention. Many embodiments of the present invention will become clear to those skilled in the art in light of the teachings of the specification. For example, the described embodiments involve the use of field programmable arrays having an orthagonal array of antifuses. However, the present invention is equally applicable to any device using antifuses. The invention is limited only by the claims appended hereto.

We claim:

1. A method for programming field programmable devices comprising the steps of:

providing a field programmable device including a plurality of antifuses and a test antifuse;

applying a programming voltage to said test antifuse;

measuring the current through said test antifuse to determine the time from the application of said programming voltage until a threshold current is reached;

recording said time from the application of said programming voltage until said threshold is reached; and utilizing said time for the application of said programming voltage to said test antifuse during the programming of said plurality of antifuses in said field programmable device.

2. A method as in claim 1 wherein said field programmable device is a field programmable array.

3. A method as in claim 1 wherein said test antifuse is accessed by accessing a reserved address in said field programmable device.

4. A method as in claim 1 wherein said test antifuse is accessed by separate terminals of said field programmable device from the terminals used to access said plurality of antifuses.

5. A method as in claim 1 wherein said field programmable device is encapsulated in plastic with a plurality of pins extending therefrom, said field programmable device is inserted in a socket of a tester and said test antifuse is accessed by signals provided by said tester via said plurality of pins.

6. A method as in claim 5 wherein said current through said test antifuse is measured by a current meter in said tester, said current meter measuring the current supplied by said tester through the pin of said field programmable device for receiving said programming voltage.

7. A method for programming field programmable arrays comprising the steps of:

providing a field programmable array including a plurality of antifuses and a test antifuse;

placing said field programmable array in a test/program device;

applying a programming voltage from said test/program device to said test antifuse;

measuring the current through said test antifuse to determine the time from the application of said programming voltage until a threshold current is reached;

recording said time from the application of said programming voltage until said threshold is reached in a memory in said test/program device; and utilizing said time for the application of said programming voltage to said test antifuses during the programming of said plurality of antifuses in said field programmable device.

8. A method as in claim 7 wherein said test antifuse is accessed by accessing a reserved address in said field programmable array.

9. A method as in claim 7 wherein said test antifuse is accessed by separate terminals of said field programmable array from the terminals used to access said plurality of antifuses.

10. A method as in claim 7 wherein said field programmable array is encapsulated in plastic with a plurality of pins extending therefrom, said field programmable array is inserted in a socket of said test/program device and said test antifuse is accessed by signals provided by said test/program device via said plurality of pins.

11. A method as in claim 7 wherein said current through said test antifuse is measured by a current meter in said test/program device, said current meter measuring the current supplied by said test/program device through the terminal of said field programmable device for receiving said programming voltage.

12. A method for programming field programmable arrays comprising the steps of:

provide a field programmable array housed in a package and having a plurality of pins extending therefrom, said field programmable array including a plurality of antifuses and a test antifuse;

placing said field programmable array in a socket for receiving said field programmable array and making conductive contact to said pins in a test/program device;

applying a programming voltage from said test/program device to said test antifuse;

measuring the current through said test antifuse to determine the programming time from the application of said programming voltage until a threshold current is reached;

recording said programming time in a memory in said test/program device; and utilizing said programming time for the application of said programming voltage to said test antifuses during the programming of said plurality of antifuses in said field programmable device.

13. A method as in claim 12 wherein said test antifuse is accessed by accessing a reserved address in said field programmable array.

14. A method as in claim 12 wherein said test antifuse is accessed by separate terminals of said field programmable array from the terminals used to access said plurality of antifuses.

15. A method as in claim 12 wherein said current through said test antifuse is measured by a current meter in said test/program device, said current meter measuring the current supplied by said test/program device through the terminal of said field programmable device for receiving said programming voltage.

16. An apparatus for programming field programmable devices comprising:

a receptacle for receiving a field programmable device, said field programmable device including a plurality of antifuses and a test antifuse;

a programming voltage source for application of a programming voltage to said test antifuse;

a current measuring device for measuring the current through said test antifuse to determine the time from the application of said programming voltage until a threshold current is reached;

memory for recording said time from the application of said programming voltage until said threshold and providing said time for the application of said programming voltage to said test antifuse to control the programming of said plurality of antifuses in said field programmable device.

17. An apparatus as in claim 16 wherein said field programmable device is a field programmable array.

18. An apparatus as in claim 16 wherein said test antifuse is accessed by accessing a reserved address in said field programmable device.

19. An apparatus as in claim 16 wherein said test antifuse is accessed by separate terminals of said field programmable device from the terminals used to access said plurality of antifuses.

20. An apparatus as in claim 16 wherein said field programmable device is encapsulated in plastic with a plurality of pins extending therefrom, said receptacle is a socket for receiving said field programmable device and said test antifuse is accessed by signals provided by said apparatus via said plurality of pins.

21. An apparatus as in claim 20 wherein said current measuring device is a current meter.

* * * * *